United States Patent
Wu et al.

(10) Patent No.: US 7,562,922 B2
(45) Date of Patent: Jul. 21, 2009

(54) WAFER CLAMP HAVING CHANGEABLE SUPPORTING PART

(75) Inventors: Chih-Hung Wu, Taoyuan County (TW); Hung-Sheng Chiu, Taoyuan County (TW); Kai-Sheng Chang, Taoyuan County (TW); Kuan-Yu Chu, Taoyuan County (TW)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 11/798,504

(22) Filed: May 14, 2007

(65) Prior Publication Data
US 2008/0284082 A1   Nov. 20, 2008

(51) Int. Cl.
*B25B 9/02* (2006.01)
(52) U.S. Cl. ..................... 294/99.2; 294/902
(58) Field of Classification Search ............... 294/99.2, 294/3, 7, 11, 16, 902; 414/941; 606/210, 606/211
See application file for complete search history.

(56) References Cited

U.S. PATENT DOCUMENTS

| | | | | |
|---|---|---|---|---|
| 3,611,842 A * | 10/1971 | Skipper | ...................... | 294/99.2 |
| 3,665,790 A * | 5/1972 | Jones | ......................... | 294/99.2 |
| 3,981,527 A * | 9/1976 | Ciano | .......................... | 294/99.2 |
| 4,009,899 A * | 3/1977 | Johnson | ....................... | 294/33 |
| 4,389,912 A * | 6/1983 | Dallons et al. | ................. | 81/320 |
| 5,143,414 A * | 9/1992 | Rosellini | .................... | 294/99.2 |
| 5,334,215 A * | 8/1994 | Chen | ........................... | 606/210 |

* cited by examiner

*Primary Examiner*—Dean J Kramer

(57) ABSTRACT

A wafer clamp according to the present invention always firmly clamps a wafer. A supporting arm of the wafer clamp will be replaced with a different one according to the wafer size. Moreover, with a larger area of the supporting arm, a wear resistance and a smoothness of the wafer is improved. Besides, the wafer clamp stops the wafer from slipping. Hence, the present invention has a simple structure, a good practicality and a wide application.

2 Claims, 10 Drawing Sheets

US 7,562,922 B2

WAFER CLAMP HAVING CHANGEABLE SUPPORTING PART

FIELD OF THE INVENTION

The present invention relates to a wafer clamp; more particularly, relates to clamping a wafer having a various size and hindering the wafer from slipping.

DESCRIPTION OF THE RELATED ART

A smooth surface becomes more and more important to a high-quality wafer in these years. Yet, when the wafer is clamped by a wafer clamp, an unevenness on the surface where the wafer clamp clamps, or a small are a for clamping, the wafer may slip to fall on the ground and become damaged.

Please refer to FIG. 10. A general wafer clamp 3 holds a wafer (not shown in the figure) with a clamping part 32 and a supporting part 33 by pressing a pressing part 31. However, both the clamping areas of the clamping part 32 and the supporting part 33 are too small, which may let the wafer 3 fall to the ground and be damaged. Besides, the wafer size nowadays is varied from 6 inches, 8 inches to 12 inches, and the general wafer clamp 3 does not fit those wafers having different sizes. Hence, the prior art does not fulfill all users requests on actual use.

SUMMARY OF THE INVENTION

The main purpose of the present invention is to obtain a clamping area of a wafer clamp bigger than one fifteenth are a of a wafer by a replaceable supporting part.

Another purpose of the present invention is to hinder the wafer from slipping and improve a wear resistance and a smoothness of the wafer with a simple structure, a good practicality and a wide application.

To achieve the above purposes, the present invention is a wafer clamp having a changeable supporting part, comprising a main body, which comprises a pressing part, a clamping part, a connecting part and a hinderer; and a supporting part, where the main body is made of a metal plate into a whole one of a 'V' shape having the pressing part; the supporting part has a slot at a side to be inserted with the connecting part or the supporting part has a soldering area on the back surface to be soldered with the connecting part; and the supporting part is replaceable to obtain a surface are a for clamping bigger than one fifteenth area of the wafer. Accordingly, a novel wafer clamp having a changeable supporting part is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 and FIG. 2 are the first and the second perspective views showing the first preferred embodiment according to the present invention;

DESCRIPTIONS OF THE PREFERRED EMBODIMENTS

Figure 1:
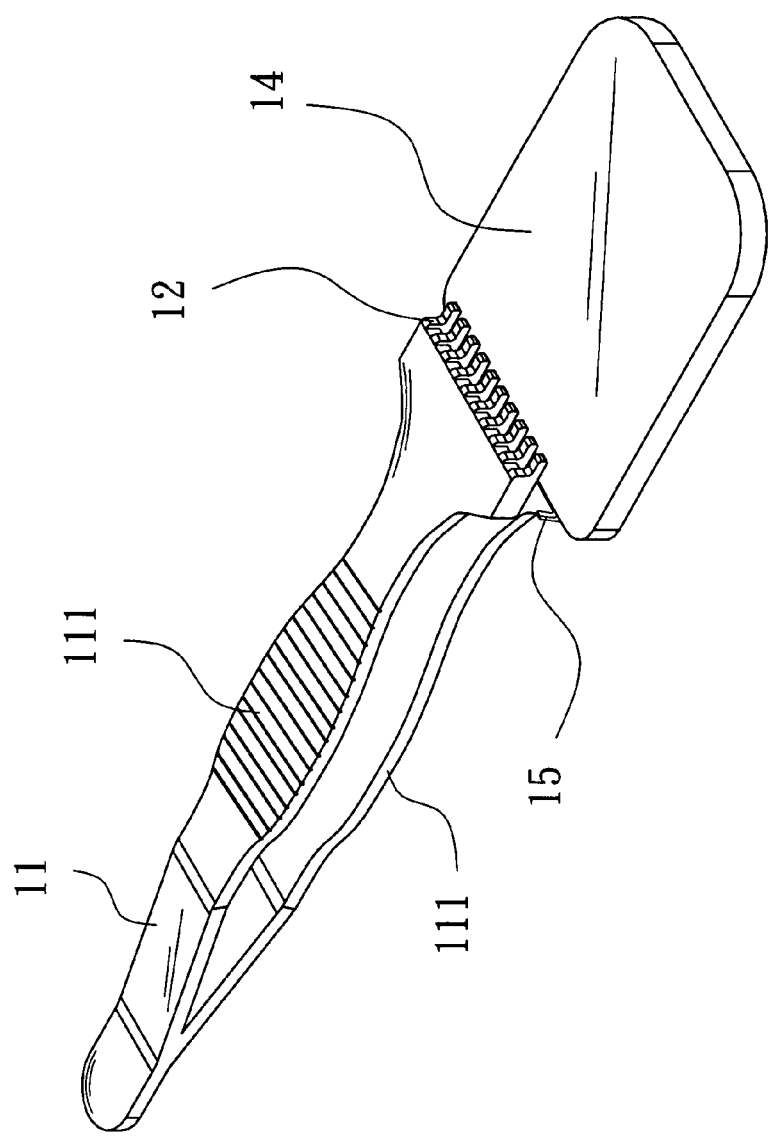
Figure 2:
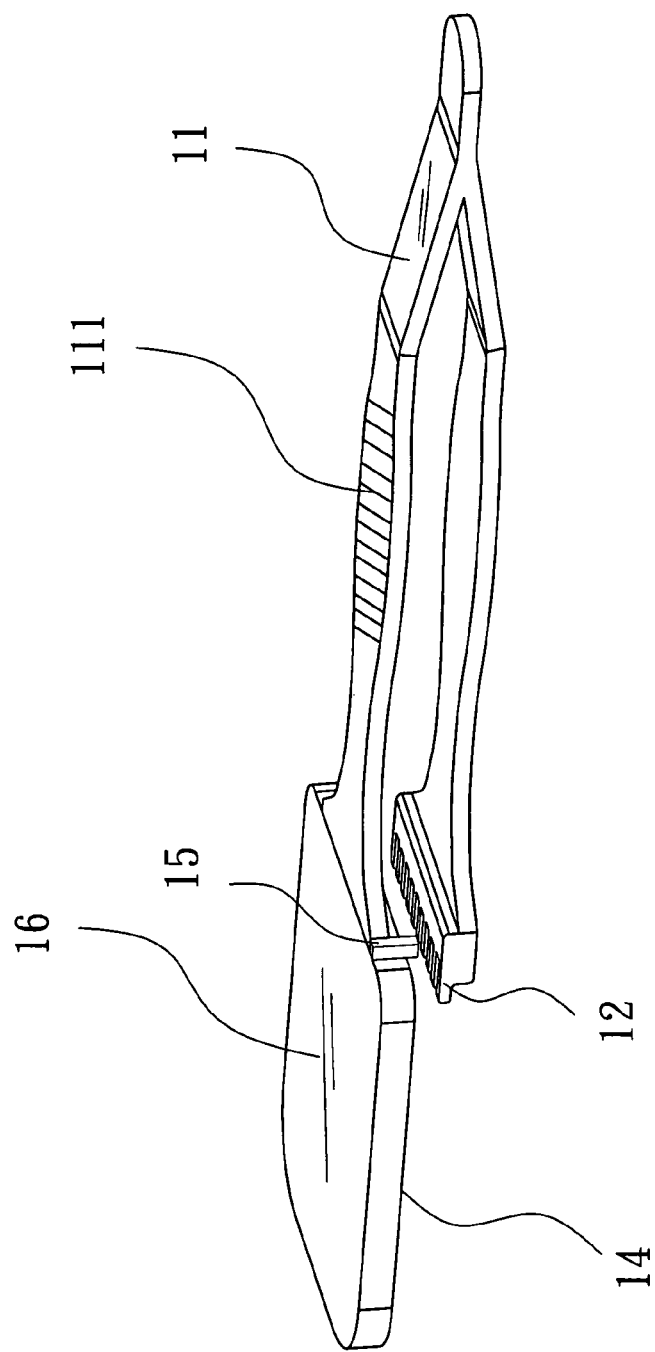

The following descriptions of the preferred embodiments are provided to understand the features and the structures of the present invention.

Please refer to FIG. 1 to FIG. 4, which are a first and a second perspective views and an explosive view showing a first preferred embodiment; and a view showing a supporting part of the first preferred embodiment according to the present invention. As shown in the figures, the present invention is a wafer clamp having a changeable supporting part, comprising a main body 11, which comprises a pressing part 111, a clamping part 12, a connecting part 13 and a hinderer 15; and a supporting part 14, where a wear resistance and a smoothness of a wafer (not shown in the figures) is improved with a replaceable supporting part 14.

The main body 11 is made of a metal plate into a whole one of a 'V' shape having the pressing part 111. The 'V' shape of the main body 11 has the clamping part 12 as an end and the connecting part 13 as the other end, where the clamping part 12 has a row of columns bending down wavily for clamping the wafer.

The supporting part 141 at a side to be inserted with the connecting part 13. And the supporting part 14 has a surface are a bigger than one fifteenth area of the wafer for clamping the wafer with a coordination of the clamping part 12. Moreover, the supporting part 14 can be replaced with another supporting part having a different surface area according to an area size of a different wafer clamped.

The hinderer 15 is extended from a side of the connecting part 13 and is turned perpendicularly to the side of the supporting part 14, where the hinderer 15 is coordinated with the clamping part 12 and the supporting part 14 to firmly hold the wafer and to avoid from slipping.

Thus, a novel wafer clamp having a changeable supporting part is obtained.

Figure 3:
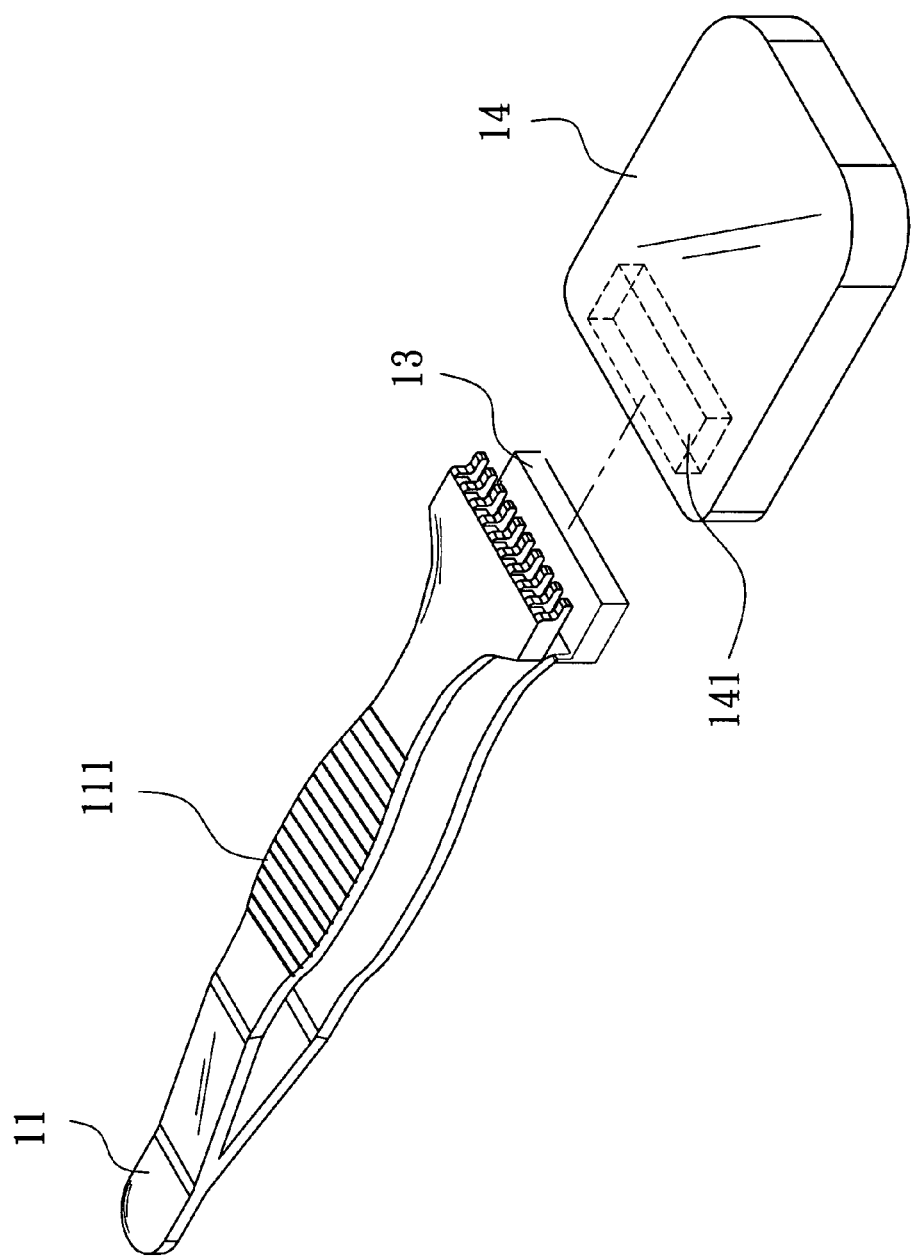
FIG. 3 is the explosive view showing the first preferred embodiment.
Figure 4:
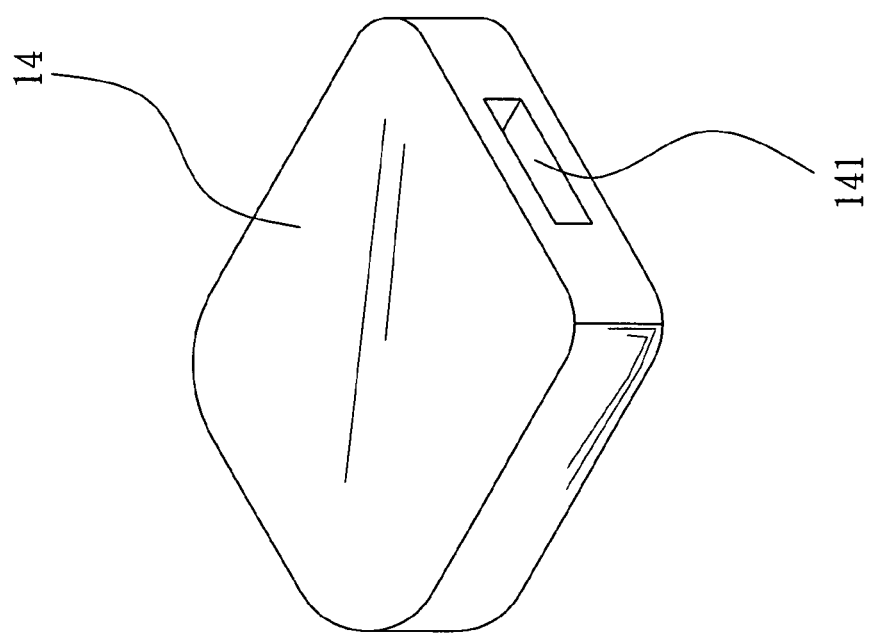
FIG. 4 is the view showing the supporting part of the first preferred embodiment.
Figure 5:
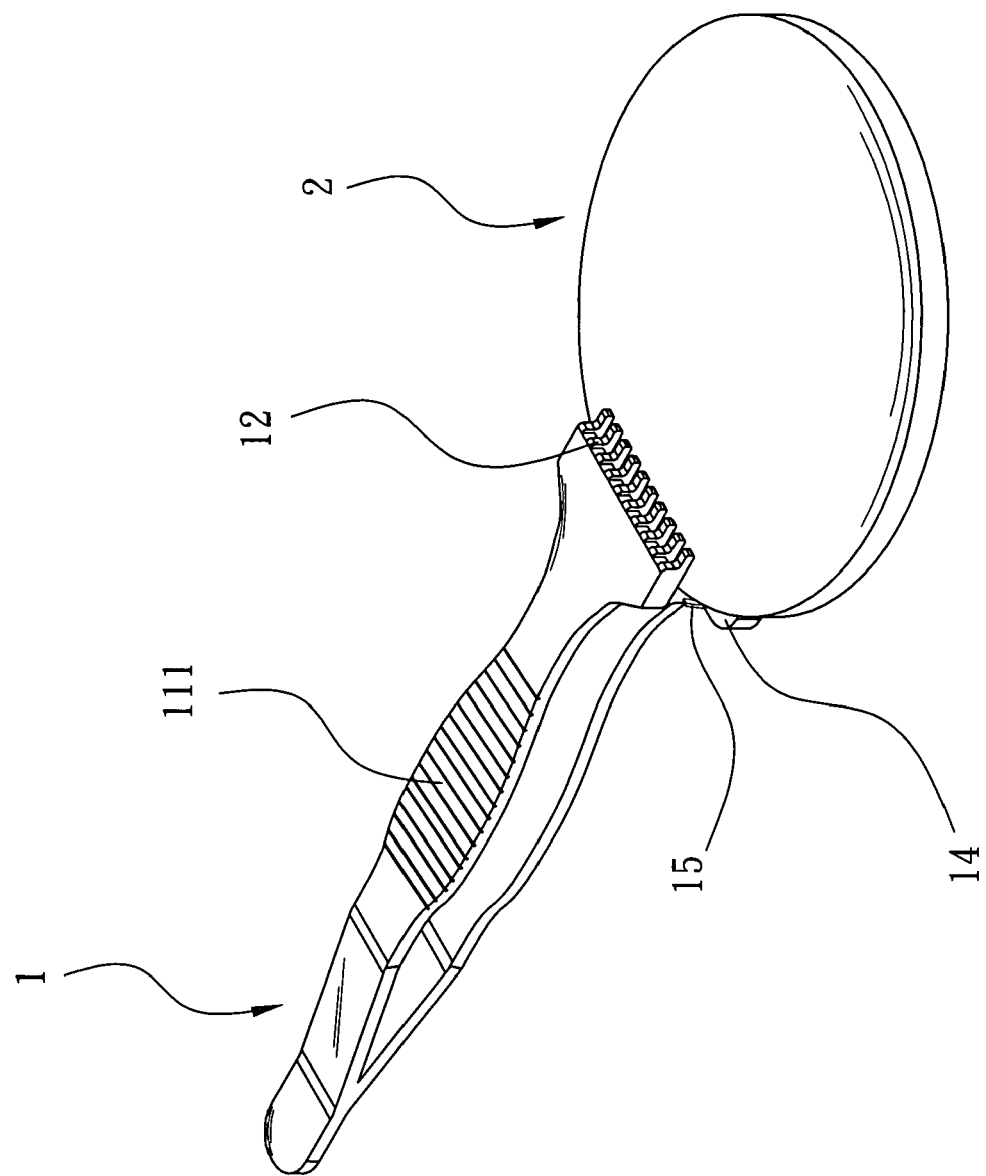
FIG. 5 is the view showing the use of the present invention.
Figure 6:
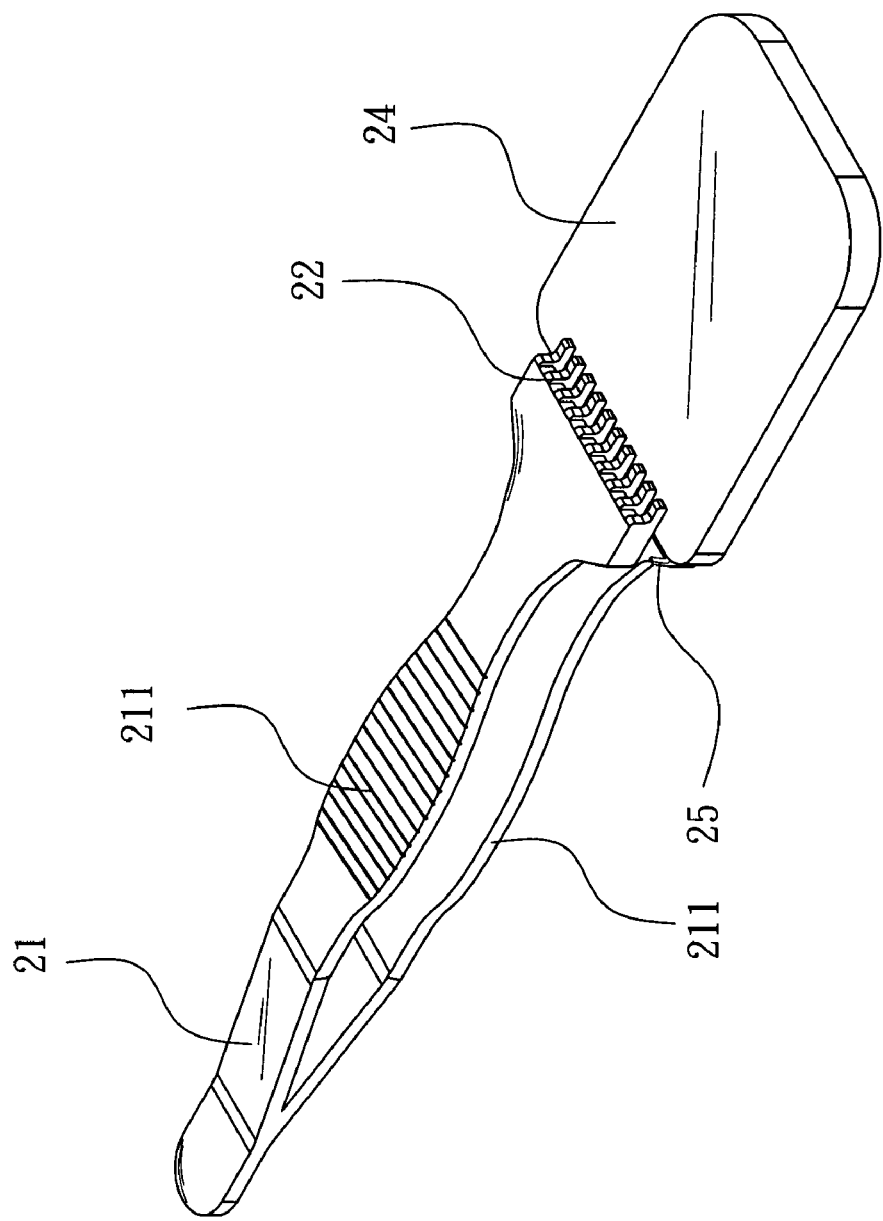
FIG. 6 to FIG. 8 are the first, the second and the third perspective views showing the second preferred embodiment.
Figure 7:
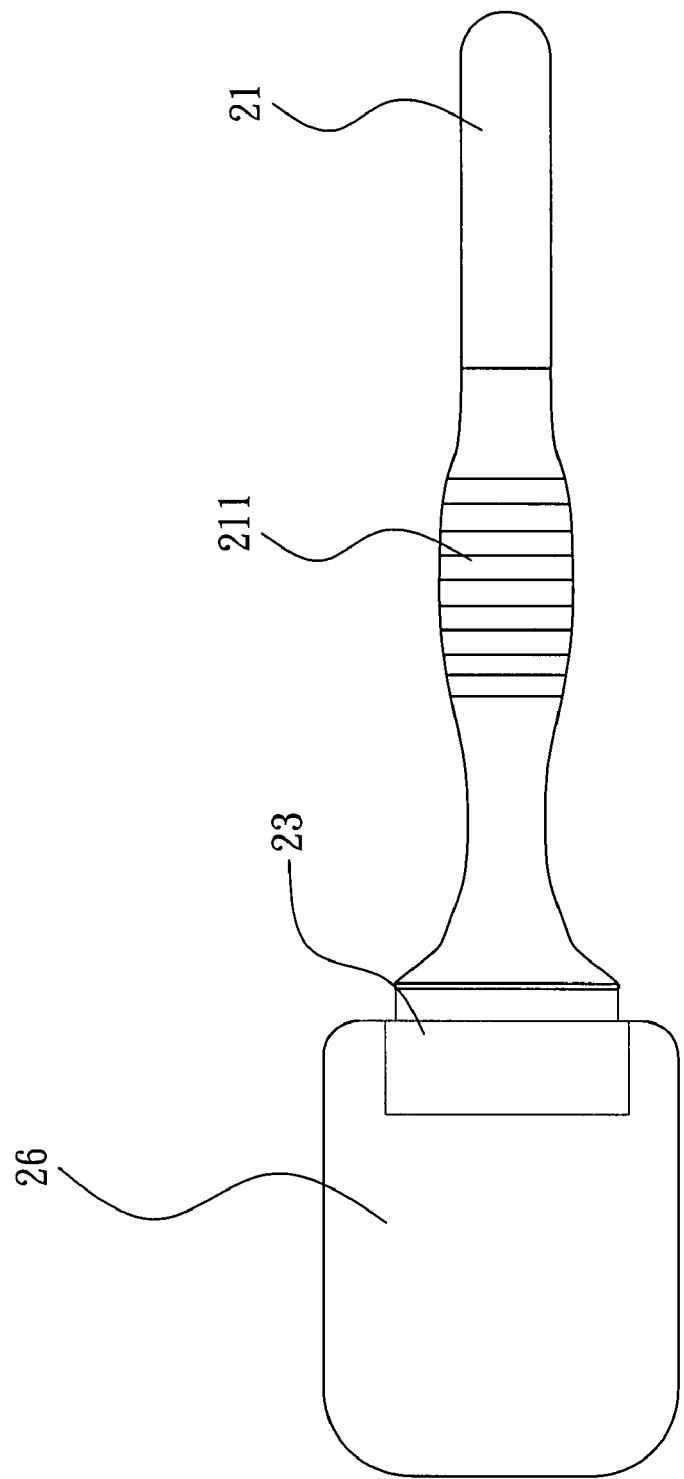
Figure 8:
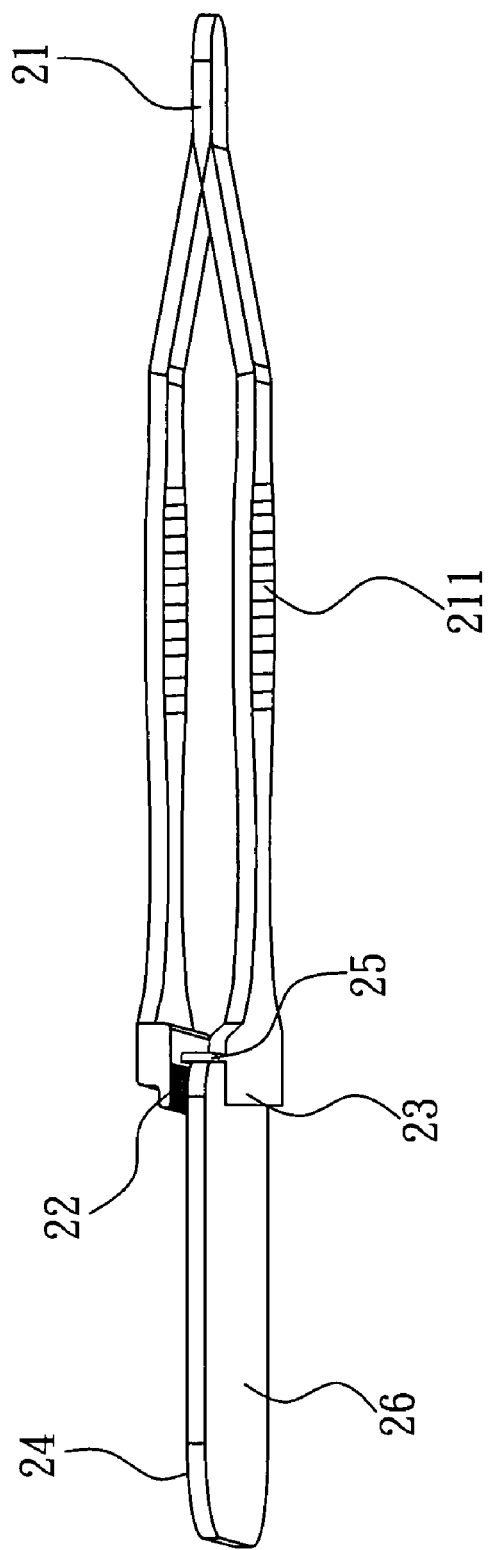
Figure 9:
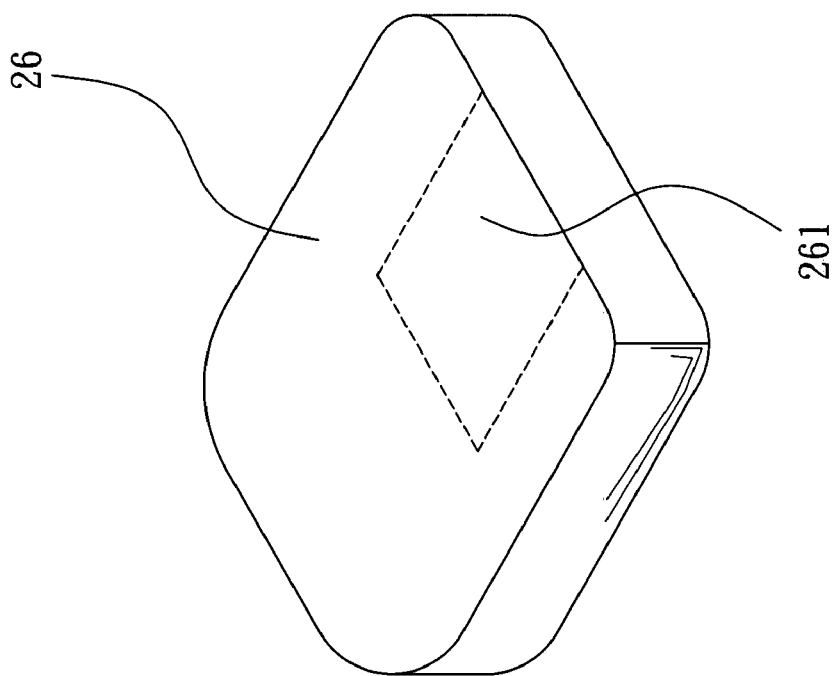
FIG. 9 is the view showing the supporting part of the second preferred embodiment.
Figure 10:
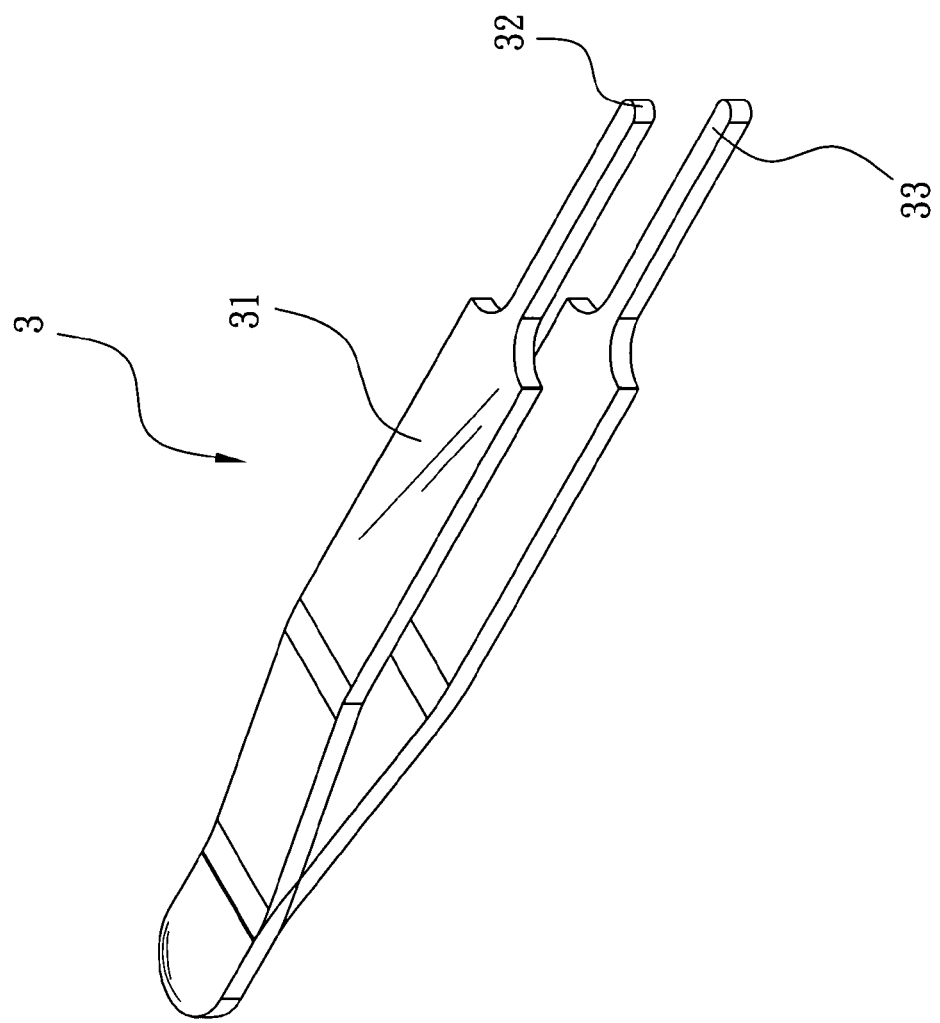
FIG. 10 is the view of the general wafer clamp.

Please refer to FIG. 5, which is a view showing a use of the present invention. As shown in the figure, a connecting part 13 (as shown in FIG. 3) of the wafer clamp 1 is inserted into a supporting part 14, where size of the supporting part 14 is changeable according to size of a wafer 2; and the area size of the supporting part 14 is one fifteenth of that of the wafer 2 for holding the wafer 2. And a hinderer 15 is extended from aside of the connecting part 13 and is turned perpendicularly to that side of the supporting part 14 for hindering the wafer 2. In this way, the wafer clamp clamps the wafer 2 with the clamping part 12 and the supporting part 14 by pressing the pressing part 111; and, the hinderer 15 hinders the wafer 2 from slipping.

Please refer to FIG. 6 to FIG. 9, which are a first, a second and a third perspective views showing a second preferred embodiment; and a view showing the supporting part of the second preferred embodiment. As shown in the figures, the present invention is a wafer clamp having a changeable supporting part, comprising a main body 21, which comprises a pressing part 211, a clamping part 22, a connecting part 23 and a hinderer 25; and a supporting part 24, where a wear resistance and a smoothness of a wafer is improved with a simple structure, a good practicality and a wide application.

The main body 21 is made of a metal plate into a whole one of a 'V' shape having the pressing part 211. The 'V' shape of the main body 21 has the clamping part 22 as an end and the connecting part 23 as the other end, where the clamping part 22 has a row of columns bending down wavily for clamping the wafer.

The supporting part 24 has a soldering area 261 on a back surface 26 of the supporting part 24 to be soldered with the connecting part 23. And the supporting part 24 has a surface area bigger than one fifteenth area of the wafer to clamp the wafer with a coordination of the clam ping part 22.

The hinderer 25 is extended from a side of the connecting part 23 and is turned perpendicularly to the side of the supporting part 24, where the hinderer 25 is coordinated with the clamping part 22 and the supporting part 24 to firmly hold the wafer and to avoid from slipping.

To sum up, the present invention is a wafer clamp having a changeable supporting part, where the wafer clamp has a changeable clamping area bigger than one fifteenth are a size of a wafer and has a hinderer to hinder the wafer from slipping; and the present invention has a simple structure, a good practicality and a wide application.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A wafer clamp having a changeable supporting part, comprising:

a main body and a supporting part, said supporting part comprising a pressing part;

a clamping part;

a connecting part; and a hinderer, wherein said main body is made of a metal plate formed into a 'V' shape having said clamping part as an end and said connecting part as the other end, wherein said supporting part has a soldering area on a back surface of said supporting part and has a front surface configured to support a wafer, the supporting part having an area bigger than one fifteenth area of said wafer, wherein said connecting part is soldered on said soldering area, wherein said supporting part is changeable by desoldering said connecting part and soldering a different supporting part on said connecting part, wherein a row of linear columns extends from said clamping part, each linear column extending substantially parallel to said main body, and wherein said hinderer is extended from a side of said connecting part and is turned perpendicularly to a side of said supporting part.

2. The wafer clamp according to claim 1, wherein said wafer is clamped by said clamping part and said supporting part; and wherein, with a coordination of said hinderer, said wafer is prevented from slipping.

* * * * *